(12) United States Patent
Lim et al.

(10) Patent No.: US 7,271,879 B2
(45) Date of Patent: Sep. 18, 2007

(54) DECOUPLED PLANAR POSITIONING SYSTEM

(75) Inventors: Ser Yong Lim, Singapore (SG); Wei Lin, Singapore (SG); Yong Peng Leow, Singapore (SG)

(73) Assignee: Agency for Science, Technology and Research, Centros (SG)

( * ) Notice: Subject to any disclaimer, the term of this patent is extended or adjusted under 35 U.S.C. 154(b) by 297 days.

(21) Appl. No.: 10/490,467

(22) PCT Filed: Sep. 24, 2001

(86) PCT No.: PCT/SG01/00190
§ 371 (c)(1),
(2), (4) Date: Aug. 16, 2004

(87) PCT Pub. No.: WO03/026838
PCT Pub. Date: Apr. 3, 2003

(65) Prior Publication Data
US 2004/0263108 A1    Dec. 30, 2004

(51) Int. Cl.
*G03F 7/20* (2006.01)
*G03F 7/62* (2006.01)
*H02K 41/03* (2006.01)

(52) U.S. Cl. .............................. 355/75; 310/12; 310/13; 310/14; 355/53; 355/72; 74/479.01; 33/1 M; 33/568

(58) Field of Classification Search .................. 310/12, 310/15, 17; 414/935, 936; 335/53, 72, 75; 74/479.01; 33/1 M, 568, 573; 355/53, 72, 355/75
See application file for complete search history.

(56) References Cited

U.S. PATENT DOCUMENTS

| | | | |
|---|---|---|---|
| 4,492,356 A | | 1/1985 | Taniguchi et al. |
| 4,575,942 A | * | 3/1986 | Moriyama ................... 33/1 M |
| 4,676,492 A | | 6/1987 | Shamir |
| 5,040,431 A | * | 8/1991 | Sakino et al. ............ 74/490.09 |
| 5,228,358 A | | 7/1993 | Sakino et al. |
| 5,523,941 A | | 6/1996 | Burton et al. |
| 5,524,502 A | * | 6/1996 | Osanai .................... 74/490.07 |
| 5,648,690 A | | 7/1997 | Hinds |

(Continued)

*Primary Examiner*—Tran Nguyen
(74) *Attorney, Agent, or Firm*—Hogan & Hartson LLP

(57) ABSTRACT

A planar positioning system having a rigid base, and first and second linear actuator means mounted to the rigid base, the first and second linear actuator means being arranged orthogonal to one another. A rigid reference surface (2A, 2B) is mounted to the base, (1) and a moveable platform (17) for holding a workpiece is supported for movement on the rigid reference surface (2A, 2B). First and second guiding means are coupled to moveable portions of the respective first and second actuator means, the first and second guiding means being arranged to bear on the moveable platform for transmission of forces thereto from the respective first and second actuator means to effect movement of the platform (17) on said rigid reference surface (2A, 2B). The first actuator means may comprise two linear actuators (4A, 4B) parallel to one another and spaced apart with the second linear actuator means (8) orthogonal thereto and arranged in an H-shaped configuration. The first and second guiding means and/or the components of the moveable platform (17) against which they bear are preferably constructed for low frictional movement in the direction orthogonal to the transmission of forces therefrom, such as by the use of non-contact aerostatic bearings (16A, 16B, 16C) or the like. Similarly, low friction bearings are utilised between the moveable platform (17) and the reference surface (2A, 2B).

38 Claims, 6 Drawing Sheets

U.S. PATENT DOCUMENTS 5,699,621 A * 12/1997 Trumper et al. ............. 33/1 M
5,939,852 A *  8/1999 Akutsu et al. ............. 318/640
6,359,679 B1 * 3/2002 Ito et al. ...................... 355/75
6,784,978 B2 * 8/2004 Galburt ...................... 355/72

* cited by examiner

"H" configuration

"T" configuration

"U" configuration

"L" configuration

DECOUPLED PLANAR POSITIONING SYSTEM

FIELD OF THE INVENTION

This invention relates to an electromechanical planar positioning system which enables high-precision, high-payload positioning of workpieces such as integrated circuit wafers, photonic components, micro-electromechanical systems and the like.

BACKGROUND OF THE INVENTION

A conventional XY planar positioning system stacks an X-actuator assembly onto a Y-actuator assembly to form the two orthogonal axes. One significant drawback of this stacking approach is that the positioning accuracy is substantially affected by the errors in each of the individual actuator assemblies. Since the actuator assemblies are coupled together, the errors of an actuator in every direction will all contribute to the overall positioning errors of the system.

Another disadvantage of stacked stages is the poor efficiency of the actuator power used for moving the payload. In such a system an actuator is required to move not only the payload but also the mass of the other actuator stacked on top of it. This necessitates the use of higher capacity actuators to overcome the problem, thereby increasing the cost of the system. Furthermore, the stacking approach reduces the overall rigidity of the system.

Whilst the conventional approach of stacking actuators has intrinsic problems of inaccuracy and low power efficiency, some prior art systems attempt to address the problems of stacking X and Y-actuator assemblies. For example, U.S. Pat. No. 5,648,690 to Hinds reveals a design wherein the actuators are not stacked but are fixed in the same plane in which the payload platform moves. However, this design has the problem of a very poor ratio of platform moving area versus the overall size of the stage footprint. This ratio is referred to herein as the footprint efficiency. Another approach, as disclosed in U.S. Pat. No. 4,676,492 to Shamir, has a similar configuration in that all the actuator assemblies are fixed on the same plane as the moving platform. Instead of using actuators to push and pull the platform at the planes perpendicular to the moving directions of the platform as presented by Hinds, the Shamir configuration realises platform motion with a pair of screw-driven actuators arranged at two sides of the platform in each of the two X-Y directions. The fact that both actuator pairs are located outside of the dimensions of the moving platform still result in a poor footprint efficiency, however.

One approach to resolving the problem of low footprint efficiency is described in U.S. Pat. No. 5,523,941 to Burton et al. In this design, two sets of actuator assemblies are mounted orthogonally below the moving platform with one set positioned on top of the other. However, in order to achieve an improved ratio of moving range versus total footprint as well as suitable platform rigidity, the platform has to be supported by at least four points on the base. As a result, the positioning accuracy of the system is negatively affected. Furthermore, as the vertical distance between the moving platform and the lower actuator assembly is long, the large offset required for the force transmission reduces the stiffness of the system, which is undesirable.

SUMMARY OF THE INVENTION

In accordance with the present invention, there is provided a planar positioning system having a rigid base, and first and second linear actuator means mounted to the rigid base, the first and second linear actuator means being arranged orthogonal to one another. A rigid reference surface is mounted to the base, and a moveable platform for holding a workpiece is supported for movement on the rigid reference surface. Two push bars are coupled to moveable portions of the respective first and second actuator means, the two push bars being arranged to bear on the moveable platform for transmission of forces thereto from the respective first and second actuator means to effect movement of the platform on said rigid reference surface.

In a preferred form of the invention, the first linear actuator means comprises two linear actuators arranged substantially parallel to each other with the second linear actuator means positioned therebetween. Preferably the distance between the linear actuators of the first linear actuator means is greater than the range of motion of the second linear actuator means. The second linear actuator means is preferably aligned substantially at the centre of the range of motion of the first actuator means.

In the preferred embodiment, the reference surface is provided by at least one reference block having a smooth upper surface, the at least one block being mounted on the rigid base at least partially between guiding mechanisms of the first linear actuator means. Preferably a pair of reference blocks is provided with the second linear actuator means therebetween. In the preferred embodiment, each of the reference blocks is kinematically supported and at each supporting points is adjustable for calibration and alignment of the smooth upper surfaces thereof to form the reference surface.

The planar positioning system of the preferred embodiment may include positional sensing means for closed loop feedback control of the first and second linear actuator means.

In one form of the invention the positional sensing means comprises a pair of linear optical encoders, one associated with each of the linear actuator means. Each linear optical encoder may comprise an optical read-head, and optical linear scale, and an index sensor to mark a zero position of the axis of motion. Preferably the optical linear scale of each optical linear encoder is fixedly mounted on the rigid base whereby temperature variation is relatively small. The optical read-head of each optical linear encoder is preferably mounted on the moveable portion of a respective one of the first and second linear actuator means.

In another form of the invention, the positional sensing means comprises a laser interferometer measurement system, such as comprising a laser source and pick-up device, an optical beam splitter, and two precision mirror surfaces mounted orthogonal to one another on said moveable platform. Preferably the laser source and pick-up device and beam splitter are mounted on said rigid base. The optical beam splitter is used to convert a single laser beam from said laser source into two orthogonal laser beams in directions parallel to the axes of motion of the first and second linear actuator means, respectively. The orthogonal laser beams are directed on the said mirror surfaces respectively so that the distance from the mirror surfaces to the laser source is varied when the platform moves in the direction of motion, and the distance can be measured precisely by the laser interferometer.

In the preferred embodiment the two push bars are arranged in orthogonal directions of motion for transmission of force from the actuator means to the moveable platform to effect motion in the respective direction. The push bars may comprise straight guiding surfaces to guide the orthogonal motion of the moveable platform. In a preferred embodiment, the two push bars together with non-contact pusher mechanisms transmit forces from the first and second actuator means to the moveable platform with minimal friction.

In one broad sense, the present invention comprises a planar positioning system having a fixed flat reference surface; first and second actuator means mounted in relation to said reference surface, the first and second actuator means each having a respective moveable portion that is linearly moveable, wherein the first and second actuator moveable portions are restricted to movement in respective first and second orthogonal linear dimensions parallel to said reference surface; a moveable platform for holding a workpiece, the moveable platform being supported for planar movement over said reference surface; a first coupling between the first actuator moveable portion and the moveable platform for controlling the position of the platform in the first linear dimension, the first coupling permitting free movement of the platform in the second linear dimension; and a second coupling between the second actuator moveable portion and the moveable platform for controlling the position of the platform in the second linear dimension, the second coupling permitting free movement of the platform in the first linear dimension.

The decoupled planar positioning system disclosed herein uses novel design to provide high speed, high precision planar motion with excellent footprint efficiency and dynamic stiffness. Decoupling of the actuators that provide the orthogonal axes of motion means that none of the actuators is carrying the weight of the other actuators and hence improving the overall efficiency of the system. In addition, decoupling also means that the errors and dynamics of one direction of motion will not propagate to or reflect in the other direction of motion. By having independent axis of motion also means that position feedback can be taken from a single independent reference surface and hence reduces the cost of achieving precision motion. In addition, by using non-contact mechanisms, there is virtually no friction in the motion of the platform that carries the workpiece. Hence very high-speed and precise motion can be achieved easily.

As will be appreciated from the following detailed description of the invention, preferred embodiments thereof aim to provide a planar positioning system which has all of the advantages of a decoupled X-Y stage in addition to low vertical profile, moderate footprint size, and is able to achieve fast motion and very high positioning accuracy.

The prior art systems mentioned above indicate that the advantages of low profile and small footprint cannot be achieved at the same time. Stacking up the driver assemblies below the platform makes the footprint smaller but at the same time increases the height of the profile. On the other hand, fixing the actuator assemblies in the same plane of the platform tremendously enlarges the system footprint. Embodiments of the present invention allow a balance between the desirable height profile and footprint, which can be achieved by fixing a pair of parallel actuator assemblies outside the moving platform while placing the other orthogonal assembly directly under the platform.

BRIEF DESCRIPTION OF THE DRAWINGS

A preferred embodiment of the invention is described in detail hereinbelow, by way of example only, and with reference to the accompanying drawings, in which.

DETAILED DESCRIPTION OF THE PREFERRED EMBODIMENT

Figure 1:
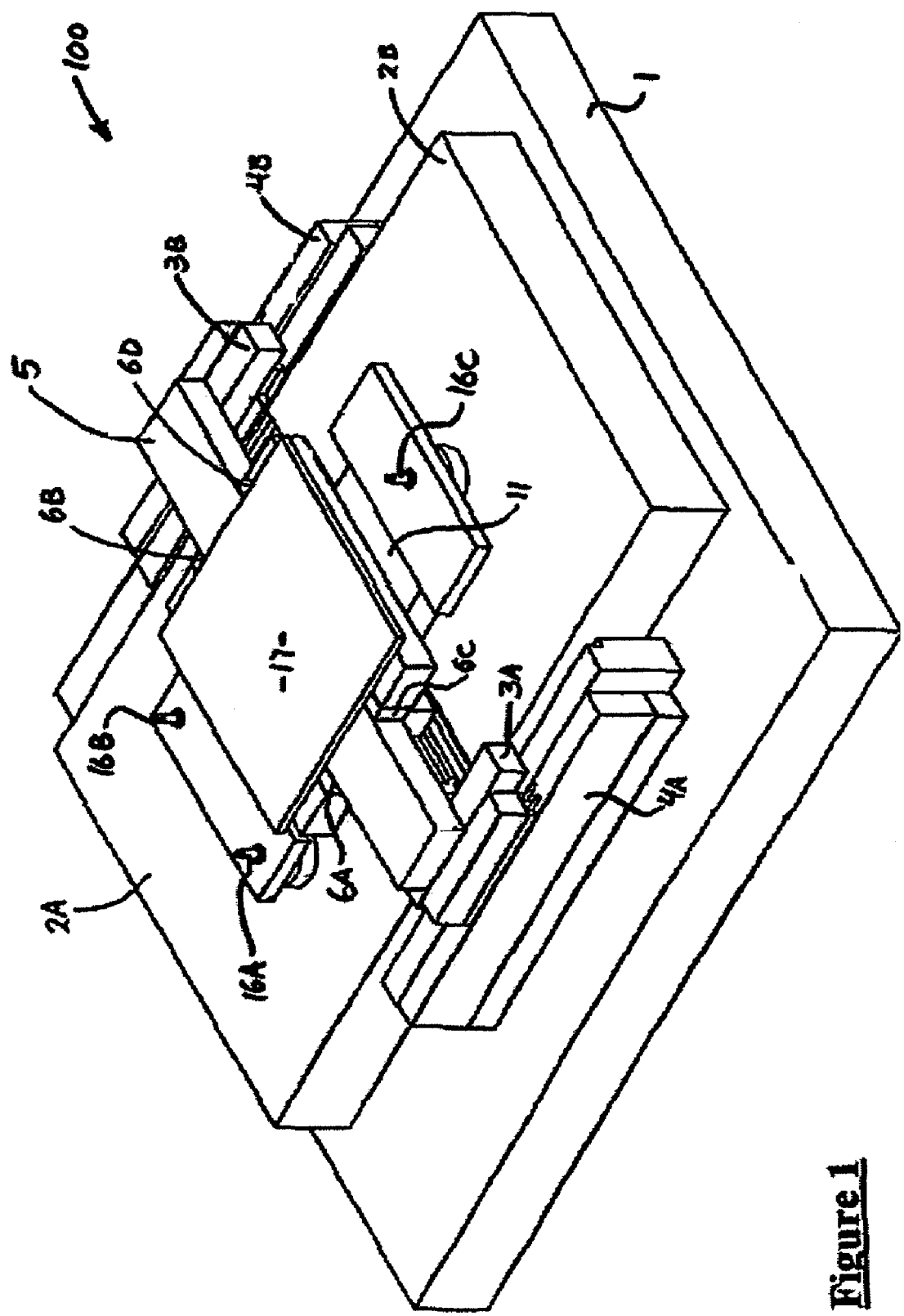
FIG. 1 is a perspective view of a planar positioning system according to a preferred embodiment of the present invention, showing the basic layout of the two axes and planar platform with respect to the base reference.

A decoupled planar positioning apparatus 100 is illustrated in the drawings, constructed according to a preferred embodiment of the present invention. The overall structure of the positioning apparatus 100 which is illustrated in FIG. 1 can be considered as a combination of several sub-assemblies, namely an X-axis assembly 200 shown in isolation in FIG. 2, a Y-axis assembly 300 shown in FIG. 3, and a planar platform assembly 400, shown in FIG. 4. The positioning apparatus 100 is also shown in FIG. 5 equipped with displacement measuring interferometer systems.

The structure of the positioning apparatus as shown in FIG. 1 includes a table top 1 and reference plates 2A and 2B. The reference plates 2A, 2B are similarly sized rectangular plates supported on an upper surface of the table top 1, and positioned adjacent one another with a gap between their adjacent edges. The two reference plates 2A and 2B are kinematically supported on the table top 1 at three location per plate. Level adjusting mechanisms are provided to allow for flatness alignment of the two reference plates 2A and 2B, to achieve a flat plane upon which a planar platform assembly 400 may glide during operation of the apparatus.

Figure 2:
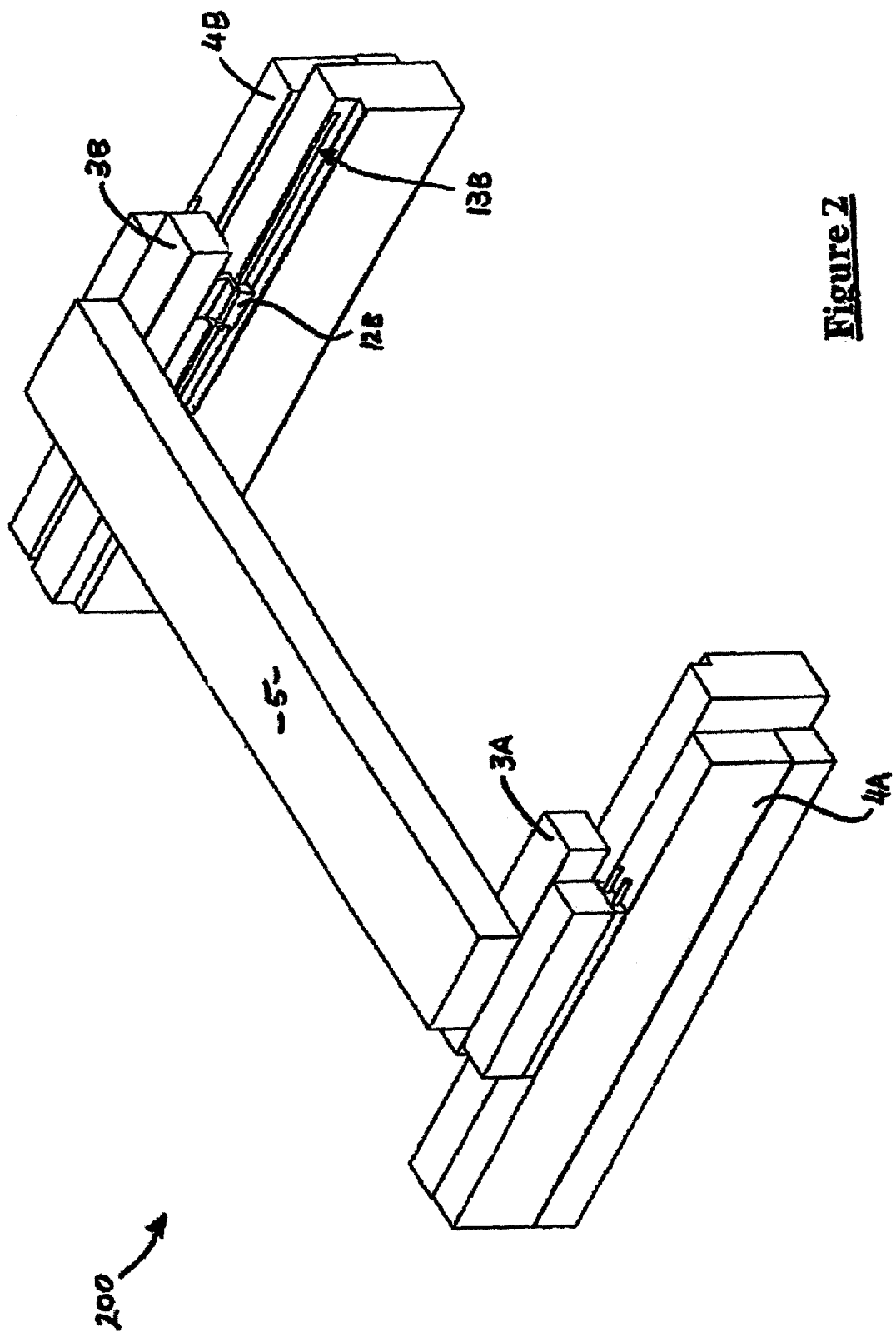
FIG. 2 is a perspective view showing the X-axis component layout of the system of FIG. 1.

The X-axis assembly 200 as seen in FIGS. 1 and 2 comprises X-axis actuator guiding elements 3A and 3B, X-axis actuators 4A and 4B, an X-axis push bar 5, X-axis measuring scales 13A (not shown) and 13B, and X-axis position sensors 12A (not shown) and 12B. The X-axis actuators 4A and 4B are linear actuators that are positioned parallel to one another adjacent sides of the reference plates 2A, 2B in the region of the gap between the plates. The X-axis actuators 4A and 4B are mounted on the table top 1 and its motion guided by the X-axis actuator guiding elements 3A and 3B, which in turn support the X-axis push bar 5 between them. The X-axis actuator guiding elements 3A and 3B may be an aerostatic bearing system for high speed applications, a hydrostatic bearing system for heavy duty applications, or a rolling bearing system for operating in vacuum environment, for example. The X-axis push bar 5 provides a sliding surface along which X-axis pusher mechanisms 6A, 6B, 6C and 6D are able to slide. The X-axis push bar 5 together with the X-axis pusher mechanisms 6A, 6B, 6C and 6D, serve as a coupling for transferring the force generated by the X-axis actuators 4A and 4B to the planar platform assembly 400.

The X-axis actuators 4A and 4B may comprise a linear motor for high speed and high acceleration applications, a ballscrew and servomotor for lower speed and acceleration applications, or a voice coil for small stroke, light duty applications, for example. The position of the X-axis is determined by the X-axis position sensors 12A and 12B with respect to the X-axis measuring scales 13A and 13B. The X-axis measuring scales 13A and 13B are symmetrically positioned on the same level with the work holding device 17. The positional information generated by the position sensors is useful as a feedback signal for controlling circuitry that drives the actuators, so that precise positioning can be achieved.

Figure 3:
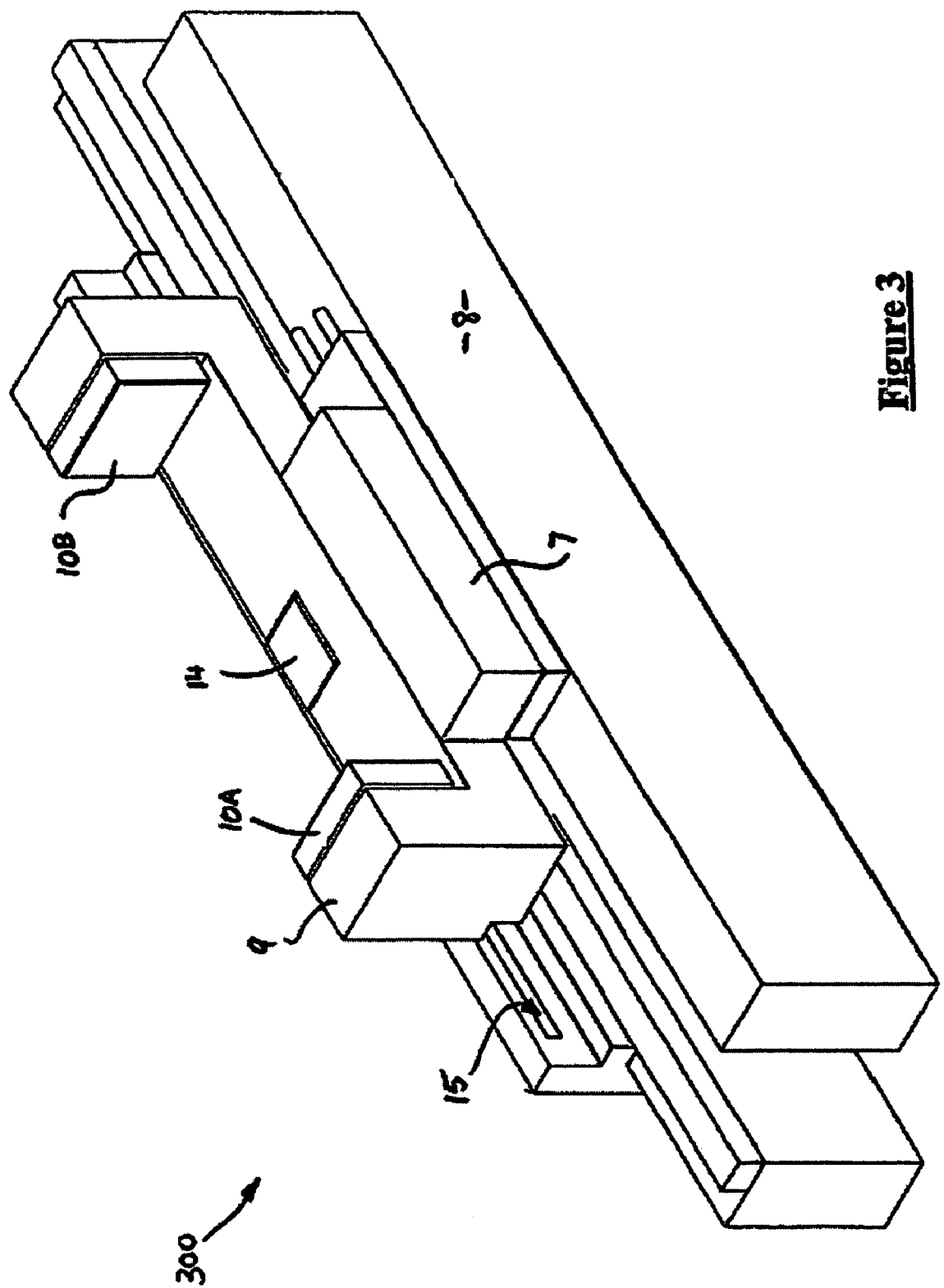
FIG. 3 is a perspective view showing the Y-axis component layout of the system of FIG. 1.

The Y-axis assembly 300 as seen in FIGS. 1 and 3, comprises a Y-axis actuator guiding element 7, a Y-axis actuator 8, a Y-axis pusher 9, a Y-axis position sensor 14, Y-axis measuring scales 15, and Y-axis pusher mechanisms 10A and 10B. The Y-axis assembly 300 is mounted on the table top 1 in the gap provided between the two reference plates 2A and 2B, with the Y-axis actuator extending perpendicularly to the X-axis actuators. As with the X-axis assembly, the motion of the Y-axis actuator 8 is guided by Y-axis actuator guiding element 7. The Y-axis actuator guiding element 7 may be an aerostatic bearing system, a hydrostatic bearing system, or a rolling bearing system as appropriate for the particular application. Similarly, the Y-axis actuator 8 may be in the form of a linear motor, a ballscrew and servomotor, or a voice coil motor, for example. The Y-axis assembly also houses the Y-axis position sensor 14 for measuring displacement in the Y-axis dimension. The Y-axis measuring scale 15 is mounted through the centreline of the work holding device 17 to reduce the potential for occurrence of Abbe errors. The Y-axis pusher 9 together with the Y-axis pusher mechanisms 10A and 10B serve as a coupling for transferring the force generated by the Y-axis actuator 8 to the Y-axis push bar 11 of the planar platform assembly 400.

Figure 4:
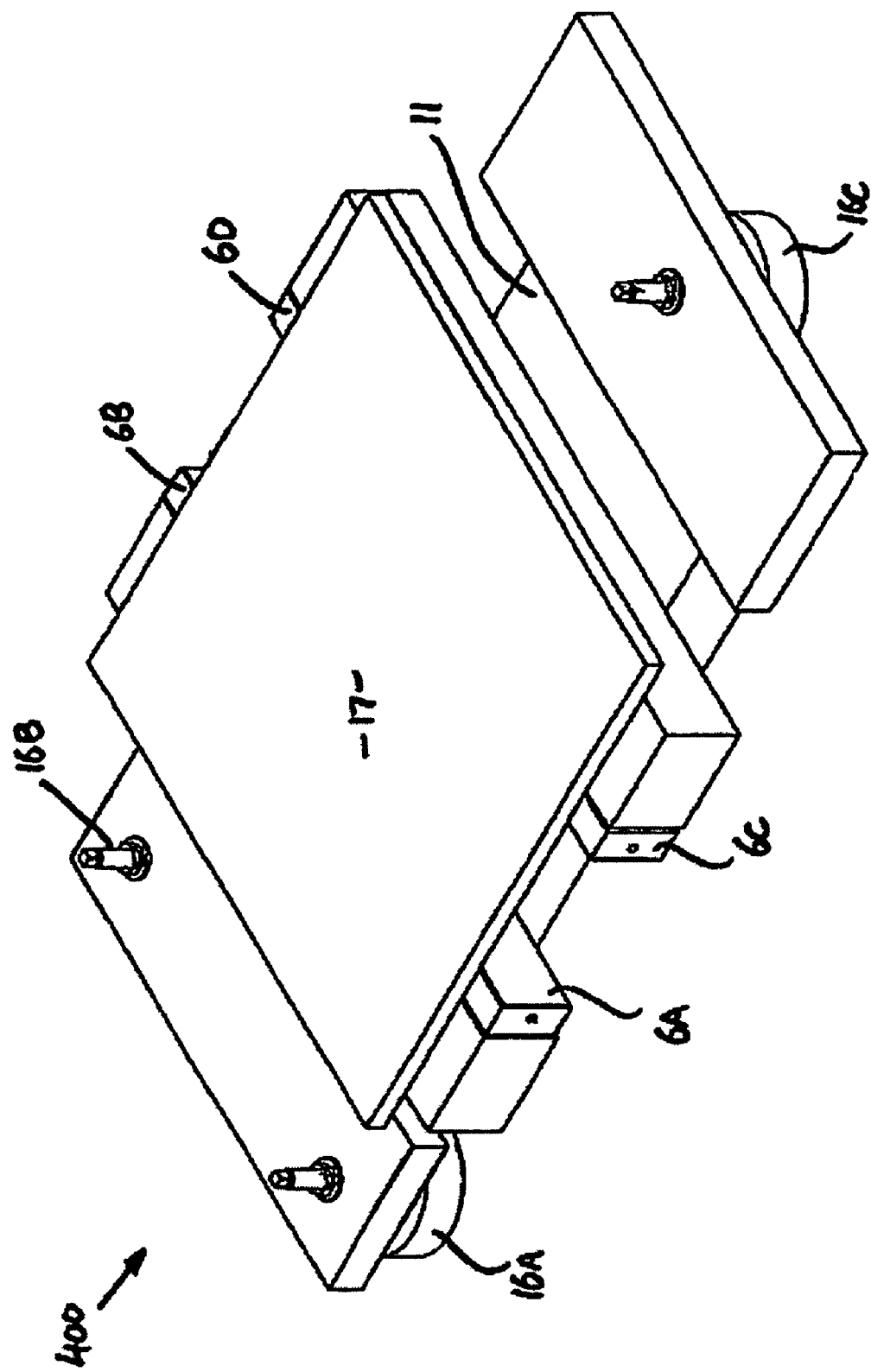
FIG. 4 is a perspective view showing the component layout on the planar platform.
Figure 5:
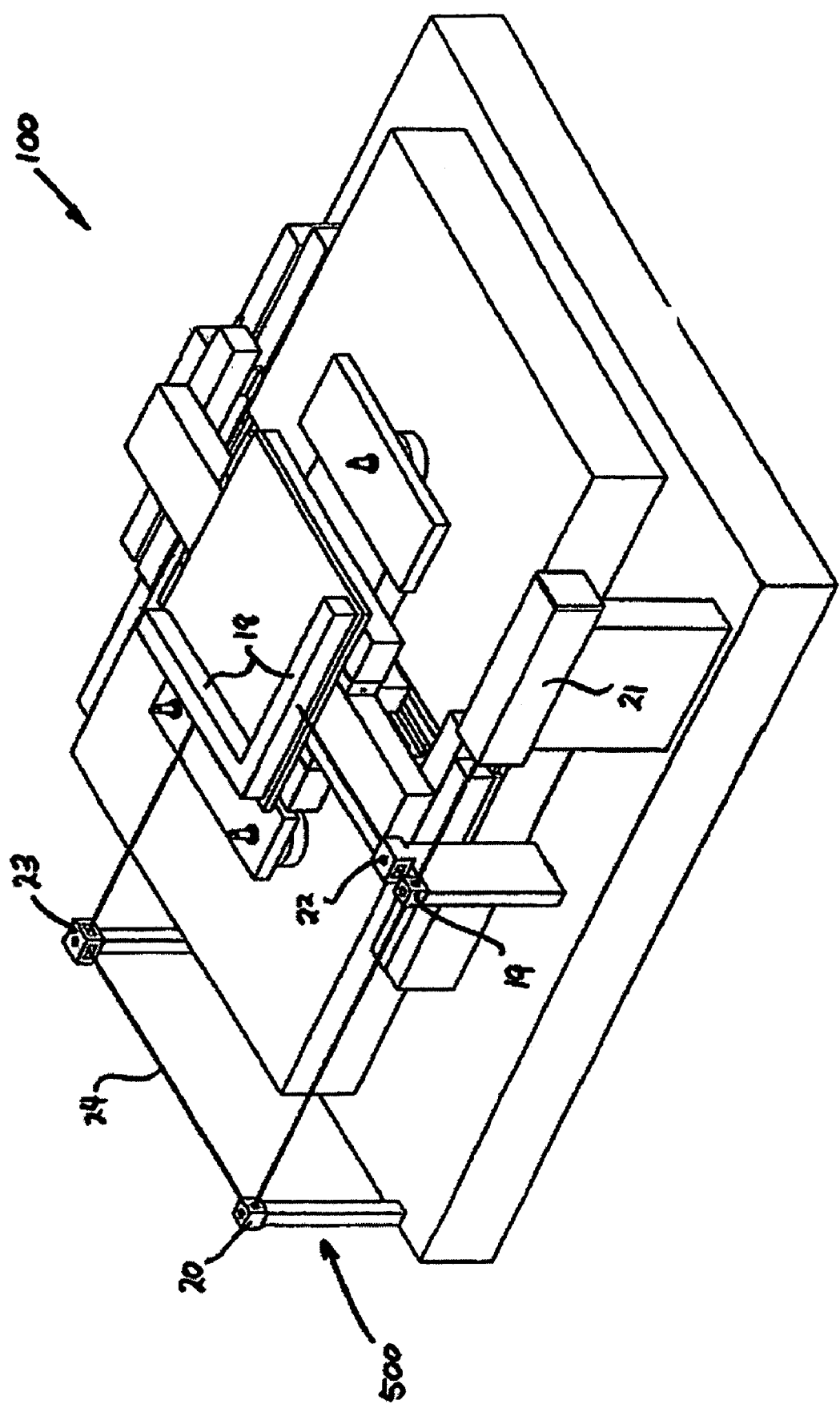
FIG. 5 is a perspective view of the planar positioning system including a laser interferometer for positional feedback.

The planar platform assembly 400 as seen in FIGS. 1 and 4, includes the Y-axis push bar 11, planar platform flotation mechanism 16A, 16B and 16C, and the work holding device 17. The planar platform assembly 400 also houses the X-axis pusher mechanisms 6A, 6B, 6C and 6D. The Y-axis push bar 11 is supported on the reference plates 2A, 2B by a thin layer of air by virtue of the planar platform flotation mechanisms 16A, 16B and 16C. This arrangement allows for smooth and near zero-friction movement of the planar platform assembly 400 over the surface of the reference plates 2A, 2B. The work holding device 17 is kinematically and symmetrically supported on the Y-axis push bar 11. The work holding device 17 may comprise, for example, a vacuum chuck, a magnetic chuck, an air chuck, a mechanical chuck, sticky tape, or some other form of work holding mechanism as appropriate for the desired application.

The features of construction and operation of the planar positioning apparatus 100 are described hereinbelow with reference to the accompanying drawings and the assemblies and components introduced above.

The table top 1 provides a base for the positioning apparatus 100, and comprises a slab or the like having a substantially flat and level upper surface. The X-axis and Y-axis assemblies are mounted on the table top upper surface with the Y-axis actuator 8 extending perpendicularly between the parallel X-axis actuators 4A and 4B. A reference surface is formed by the two independently adjustable reference plates 2A, 2B which are Cinematically supported at three points on the table top 1. The reference plates 2A, 2B may comprise stone (e.g. granite) slabs, for example, and have finely adjustable mountings to allow for calibration and alignment of the upper surface planes thereof relative to each other. The reference plates 2A and 2B are also mounted on the upper surface of the table top 1 between the two X-axis actuators 4A and 4B, with the Y-axis assembly therebetween. The reference plates 2A and 2B are constructed with smooth, flat upper surfaces upon which the planar platform assembly 400 is supported.

The planar platform assembly 400 comprises a moving platform for carrying a workpiece, and is kinematically supported at three points by flotation means over the reference surface provided by the reference plates 2A, 2B, instead of being supported by the actuators. Independent orthogonal motion of the platform is effected by transmission of force from the actuators through push bars 5 and 11 via pusher mechanisms 6A-6D and 10A, 10B. The pusher mechanisms 6A-6D and 10A, 10B can act on the push bars 5 and 11 via conventional contact means to lower cost, or via non-contact means to minimise friction and hence improve dynamic performance. This arrangement allows for better payload capacity and improve the rigidity of the platform.

When assembled in the planar positioning apparatus, the planar platform assembly can be moved in two dimensions through action of the X-axis and Y-axis actuator assemblies. As best seen in FIG. 1, the X-axis push bar 5 extends between the X-axis pusher mechanisms 6A, 6B and 6C, 6D which are mounted on the planar platform assembly underneath the workpiece holding device 17. The X-axis pusher mechanisms 6A, 6B are immediately adjacent one side surface of the X-axis push bar 5, and the pusher mechanisms 6C, 6D are immediately adjacent the other side of the X-axis push bar 5. The pusher mechanisms 6A, 6B, 6C, 6D are not attached to the X-axis push bar 5, however. When the X-axis actuators 4A, 4B are moved in one direction the X-axis push bar 5 bears against pusher mechanisms 6A, 6B so as to cause corresponding movement of the planar platform assembly over the surface of the reference plates 2A, 2B. Movement of the X-axis actuators in the other direction cause movement of the planar platform assembly through action of the push bar 5 on the other pusher mechanisms 6C, 6D.

The Y-axis push bar 11 extends beneath the X-axis push bar 5 and has parallel side surfaces extending perpendicular to the push bar sides. The Y-axis pusher mechanisms 10A and 10B are positioned immediately adjacent on the respective Y-axis push bar 11 side surfaces. The Y-axis pusher mechanisms 10a, 10B are not attached to the Y-axis push bar 11, however. When the Y-axis actuator 8 is moved in one direction the pusher mechanism 10A bears against the side surface of the Y-axis push bar 11 so as to cause corresponding movement of the planar platform assembly over the surface of the reference plates 2A, 2B. Movement of the Y-axis actuator 8 in the other direction causes movement of the planar platform assembly 400 through action of other pusher mechanism 10B on the opposite side surface of the Y-axis push bar 11.

The X-axis push bar 5, in addition to providing the means for transmission of forces from the X-axis actuators 4A, 4B to the planar platform assembly 400, also serves as a guide for movement of the platform assembly in the Y-axis dimension. This is achieved by the X-axis pusher mechanisms 6A, 6B, 6C, and 6D on the platform assembly being constructed so as to slide along the side edge surfaces of the X-axis push bar 5 during movement of the planar platform assembly 400 in the Y-axis dimension. Accordingly, it is advantageous that frictional forces between the X-axis pusher mechanisms 6A-6D and the X-axis push bar 5 surfaces be minimized, such as through the use of non-contact aerostatic bearings, for example. Similarly, the Y-axis push bar 11 serves as a guide for the planar platform assembly 400 movement in the X-axis dimension, by virtue of the Y-axis pusher mechanisms 10A, 10B being located against the respective side edge surfaces of thereof.

A controller (not shown) is coupled to drive the actuators so as to position the workpiece holding device according to predetermined program or the like. The controller preferably controls the actuators in a closed loop feedback arrangement using positional signals derived from the X-axis and Y-axis position sensors, or from a laser interferometer system (described below), for example. The controller may include a memory to enable creation of a data table to record systematic errors in the overall motion of the system with respect to a precise external reference during a calibration phase. The data in the table can then be used to adjust the motion of the platform during normal use so that the systematic errors are minimised.

As will be readily appreciated, the above described construction allows the X-axis actuators 4A and 4B and Y-axis actuator 8 to act on the planar platform assembly 400 independently of one another whilst movement of the planar platform assembly 400 itself is maintained in a flat plane by gliding on the surfaces of the reference plates 2A, 2B. This structure allows for several advantages, such as:

1. The planar platform assembly 400 assembly is directly moved by the actuators which are anchored on a base so that no actuator is carrying the weight of the other. As a result, the load of the actuators is minimised and well distributed allowing a better dynamic performance of the system.
2. The planar platform assembly 400 assembly is supported directly on a rigid surface instead of the actuators. This allows a better payload capacity and rigidity for the platform.
3. The planar platform assembly 400 assembly is separated from other physical components of the system by a thin air gap. This gives the system enhanced operational life due to reduced wear and tear. The non-contact coupling also provides very low contact friction characteristics, yielding smooth backlash-free motion.
4. The moving planar platform assembly 400 assembly is supported by three aerostatic couplings in a symmetric arrangement. This provides a deterministic planar motion for the planar platform assembly 400. In addition, as the planar platform assembly 400 is supported directly on a surface, any kinematic errors in vertical direction in any actuators do not affect the platform vertical accuracy.
5. The total height of the preferred embodiment is shorter than can be achieved with stacked-actuator approaches. The low profile of the system minimises Abbe errors.
6. The actuator power efficiency is maximised by having an actuator arranged very near to the platform function point so as to minimise the moment due to the offset. The pair of actuators outside the platform provide the rigidity required for the motion in the orthogonal direction. A pair of lower power actuators can be used so that a high rigidity stage can be achieved at a lower cost.

In the above described embodiment of the planar positioning system, positional feedback is provided through the X-axis and Y-axis position sensors 2A, 12B and 14. However, even greater accuracy can be achieved by directly measuring the position of the workpiece holding device 17, rather than the actuators. In FIG. 5 the positioning apparatus 100 is shown including a displacement measuring interferometer system 500. The displacement measuring interferometer system 500 as shown comprises a laser head 21, a beam splitter 19, a fold mirror 20, a stage mirror 18 and plane mirror interferometers 22 and 23, together with the necessary interfaces, electronics and controls (not shown). The accuracy of the positioning apparatus can be improved to the nanometer scale with use of such a displacement measuring system.

The displacement measuring interferometer system 500 operates generally as follows. A measuring beam 24 is emitted from laser head 21 and directed to beam splitter 19, where a portion of the beam is directed along the Y-axis through a first plane mirror interferometer 22 and onto a Y-axis surface of the stage mirror 18. The stage mirror 18 is mounted on the workpiece holding device 17 such that the Y-axis surface thereof is perpendicular to the Y-axis of the system. The measuring beam 24 thus reflects from the stage mirror 18 surface back to the plane mirror interferometer 22, enabling precise positional determination of the workpiece holding device in the Y-axis dimension. Another portion of the measuring beam 24 passes through the beam splitter 19 to a fold mirror 20 which directs the measuring beam 24 to a second plane mirror interferometer 23. The second plane mirror interferometer 23 directs the measuring beam 24 along the X-axis and onto an X-axis surface of the stage mirror 18 that is mounted on the workpiece holding device 17 perpendicular to the X-axis. The measuring beam 24 thus reflects from the stage mirror surface 18 back to the plane mirror interferometer 23, enabling precise positional determination of the workpiece holding device 17 in the X-axis dimension.

The embodiments described above illustrate the general configuration and operation of the decoupled planar positioning system which encompasses the following features:

1. The actuator means are arranged in an H-configuration and fixed on the same plane on the supporting base to reduce footprint and the vertical profile of the system, and hence lower Abbe errors.
2. None of the actuator means is carrying the other actuators thereby minimising loading on the actuators, and maximising dynamic stability of the whole system.
3. All actuator means are arranged very near to the functional point of the system so as to minimize the moment due to offset, and hence maximize the overall power efficiency of the system.
4. The actuator means-can be independently assembled and aligned on the supporting base with appropriate guiding elements via either conventional contact means to lower cost, or non-contact means to minimize friction and hence improve dynamic performance.
5. A reference surface is formed by two independently adjustable planes kinematically supported on the supporting base. The planes have fine adjustments to allow for calibration and alignment of the two planes relative to one another.
6. A moving platform for carrying a workpiece is kinematically supported by flotation means over the reference surface so that the actuator means do not have to bear the weight of the platform and the workpiece. Independent orthogonal motion of the platform is effected by the pusher mechanisms via non-contact means. This arrangement allows for better payload capacity and improves the rigidity of the platform.
7. The transmission of force from the actuator means to the platform is via the pusher mechanisms and two push bars arranged orthogonal to each other. The X-axis push bar is coupled to the X-axis actuator means and the transmission of force in the X-axis direction is via four non-contact pushers gliding along the surfaces of the of the X-axis push bar with a very thin air gap. The Y-axis push bar is rigidly attached to the moving platform and the transmission of force from the Y-axis actuator means is via two pushers attached to the Y-axis actuator means and gliding along the surfaces of the Y-axis push bar with a thin air gap.

8. Position feedback means for precise motion control is taken directly from the moving platform with reference to the reference surface.

9. All actuators means are closed-loop controlled with position feedback means.

10. A closed loop control method is employed to distribute dynamic loading on the actuators so as to achieve optimal dynamic motion performance for stepping and scanning motion of the platform.

12. A data table is created to capture the systematic errors in the overall motion of the stage with respect to a precise external reference. The data in the table is used to adjust the motion of the stage so that the systematic errors are minimised.

Figure 6:
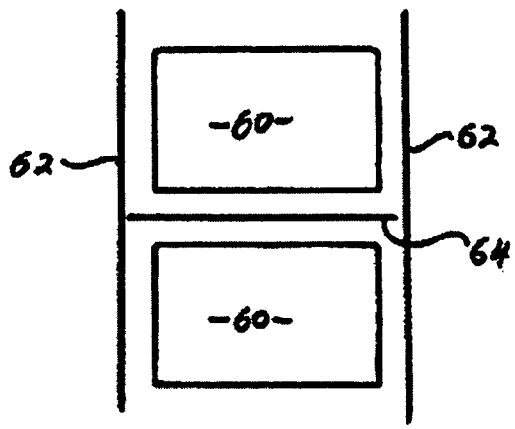
FIGS. 6, 7, 8 and 9 are schematic illustrations of various layout configurations of a planar positioning system in accordance with the present invention.
Figure 7:
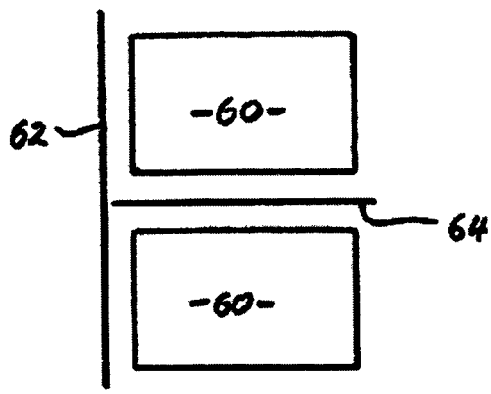
Figure 8:
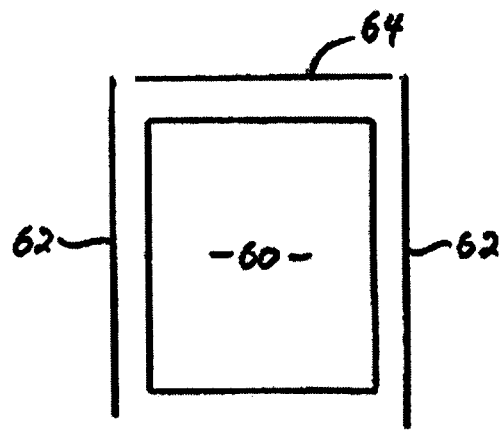
Figure 9:
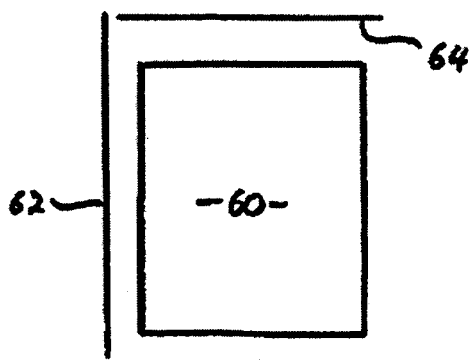

The embodiment described in detail hereinabove has a configuration in which two X-axis actuators and guiding elements extend along peripheral edges of the reference surface, and the Y-axis actuator and guiding element extends through the centre of the reference surface. This configuration is referred to as an "H" configuration, and is illustrated schematically in FIG. 6, wherein the reference surface is shown at 60, the X-axis actuators/guides at 62 and the Y-axis actuator/guide at 64. However, other configurations are also possible whilst remaining within the teachings of the present invention, including a "T" configuration, a "U" configuration and an "L" configuration. These configurations are schematically illustrated in FIGS. 7, 8 and 9, respectively.

Alternative embodiments may include any or all of the above, and may further include:

(a) using any appropriate alternative position measurement means for feedback, including laser interferometers, optical linear encoders, linear variable differential transformer, and capacitance displacement sensors;

(b) using any appropriate linear motion means such as magnetic brushless U-channel or tubular linear motors, piezo or ultrasonic linear motors, voice coil motors, or any combination of motion means; and (c) using any appropriate coupling and guiding means, including air-bearings, PTFE bearings, roller and ball bearings.

The foregoing detailed description of the preferred embodiment of the present invention has been presented by way of example only, and is not intended to be considered limiting to the present invention as defined in the claims appended hereto.

Throughout this specification and the claims which follow, unless the context requires otherwise, the word "comprise", and variations such as "comprises" and "comprising", will be understood to imply the inclusion of a stated integer or step or group of integers or steps but not the exclusion of any other integer or step or group of integers or steps.

| Schedule of Referenced Components | |
|---|---|
| 1 | Table top |
| 2A | Reference plate 1 |
| 2B | Reference plate 2 |
| 3A | X-axis actuator guiding element 1 |

| -continued | |
|---|---|
| Schedule of Referenced Components | |
| 3B | X-axis actuator guiding element 2 |
| 4A | X-axis actuator 1 |
| 4B | X-axis actuator 2 |
| 5 | X-axis push bar |
| 6A | X-axis pusher mechanism 1 |
| 6B | X-axis pusher mechanism 2 |
| 6C | X-axis pusher mechanism 3 |
| 6D | X-axis pusher mechanism 4 |
| 7 | Y-axis actuator guiding element |
| 8 | Y-axis actuator |
| 9 | Y-axis pusher |
| 10A | Y-axis pusher mechanism 1 |
| 10B | Y-axis pusher mechanism 2 |
| 11 | Y-axis push bar |
| 12A | X-axis position sensor 1 |
| 12B | X-axis position sensor 2 |
| 13A | X-axis measuring scale 1 |
| 13B | X-axis measuring scale 2 |
| 14 | Y-axis position sensor |
| 15 | Y-axis measuring scale |
| 16A | Planar platform floatation mechanism 1 |
| 16B | Planar platform floatation mechanism 2 |
| 16C | Planar platform floatation mechanism 3 |
| 17 | Work holding device |
| 18 | Stage mirror |
| 19 | Beam splitter |
| 20 | Fold mirror |
| 21 | Laser head |
| 22 | Plane Mirror Interferometer 1 |
| 23 | Plane Mirror Interferometer 2 |
| 24 | Measuring beams |

The invention claimed is:

1. A planar positioning system, comprising:
a rigid base;
first and second actuator means each having a fixed portion directly anchored to said rigid base, the first and second actuator means each having a respective moveable portion that is linearly moveable relative to the rigid base, wherein the first and second actuator moveable portions are restricted to movement in respective first and second orthogonal linear dimensions;
a flat reference surface mounted to said base;
a moveable platform for holding a workpiece, the moveable platform being supported for planar movement over said reference surface;
a first coupling between the first actuator moveable portion and the moveable platform for effecting movement of the platform in the first linear dimension, the first coupling also serving to guide the platform in the second linear dimension; and
a second coupling between the second actuator moveable portion and the moveable platform for effecting movement of the platform in the second linear dimension, the second coupling also serving to guide the platform in the first linear dimension.

2. A planar positioning system as claimed in claim 1 wherein the first linear actuator means comprises two linear actuators arranged substantially parallel to each other with the second linear actuator means positioned therebetween.

3. A planar positioning system as claimed in claim 2, wherein the distance between the linear actuators of the first linear actuator means is greater than the range of motion of the second linear actuator means.

4. A planar positioning system as claimed in claim 3, wherein the second linear actuator means is aligned substantially at the centre of the range of motion of the first actuator means.

5. A planar positioning system as claimed in claim 2, wherein said reference surface is provided by at least one reference block having a smooth upper surface, and at least one block being mounted on said rigid base at least partially between the linear actuators of the first linear actuator means.

6. A planar positioning system as claimed in claim 5, wherein the at least one reference block comprises a pair of reference blocks arranged with said second linear actuator means therebetween.

7. A planar positioning system as claimed in claim 6, wherein said reference blocks comprise stone blocks each kinematically supported at at least three points with independently adjustable supporting means.

8. A planar positioning system as claimed in claim 7, wherein each of said reference blocks have adjustable three-point supports for calibration and alignment of the smooth upper surfaces thereof to form said reference surface.

9. A planar positioning system as claimed in claim 1, including positional sensing means for closed loop feedback control of the first and second linear actuator means.

10. A planar positioning system as claimed in claim 9, wherein the positional sensing means comprises a pair of linear optical encoders, one associated with each of the linear actuator means.

11. A planar positioning system as claimed in claim 10, wherein each linear optical encoder comprises an optical read-head, and optical linear scale, and an index sensor to mark a zero position of the axis of motion.

12. A planar positioning system as claimed in claim 11, wherein the optical linear scale of each optical linear encoder is fixedly mounted on the rigid base whereby temperature variation is relatively small.

13. A planar positioning system as claimed in claim 12, wherein the optical read head of each optical linear encoder is mounted on the moveable portion of a respective one of the first and second linear actuator means.

14. A planar positioning system as claimed in claim 9, wherein the positional sensing means comprises a laser interferometer measurement system.

15. A planar positioning system as claimed in claim 14, wherein said laser interferometer measurement system comprises a laser source and pick-up device, an optical beam splitter, and two precision mirror surfaces mounted orthogonal to one another on said moveable platform.

16. A planar positioning system as claimed in claim 15, wherein said laser source and pick-up device and beam splitter are mounted on said rigid base.

17. A planar positioning system as claimed in claim 15, wherein said optical beam splitter is used to convert a single laser beam from said laser source into two orthogonal laser beams in directions parallel to the axes of motion of the first and second linear actuator means, respectively.

18. A planar positioning system as claimed in claim 17, wherein said orthogonal laser beams are directed on the said mirror surfaces respectively so that the distance from the mirror surfaces to the laser source is varied when the platform moves in the direction of motion, and the distance can be measured precisely by the laser interferometer.

19. A planar positioning system as claimed in claim 1, wherein the first coupling includes a first push bar mounted for movement with the first actuator moveable portion for transmission of forces from the first actuator means to the moveable platform in the first linear dimension, the first coupling allowing free movement of the platform in the second linear dimension.

20. A planar positioning system as claimed in claim 19, wherein the first push bar includes two straight parallel guiding surfaces extending in the second linear dimension along which first bearings mounted on the moveable platform can move, said guiding surfaces serving to transmit forces from the first actuator means to the moveable platform in the first linear dimension.

21. A planar positioning system as claimed in claim 20, wherein the first hearings comprise non-contact bearings such as aerostatic bearings.

22. A planar positioning system as claimed in claim 1, wherein the second coupling includes a second push bar mounted for movement with the moveable platform for transmission of forces from the second actuator means moveable portion to the moveable platform in the second linear dimension, the second coupling allowing free movement of the platform in the first linear dimension.

23. A planar positioning system as claimed in claim 22, wherein the second push bar includes two straight parallel guiding surfaces extending in the first linear dimension along which second bearings mounted to the second actuator moveable portion can move, said guiding surfaces serving to transmit forces from the second actuator means to the moveable platform in the second linear dimension.

24. A planar positioning system as claimed in claim 23, wherein the second bearings comprise non-contact bearings such as aerostatic bearings.

25. A planar positioning system as claimed in claim 1, wherein the first and second actuator means are selected from the group consisting of: magnetic brushless U-channel linear motors; magnetic brushless tubular linear motors; voice coil linear motors; piezo or ultrasonic linear motors.

26. A planar positioning system, comprising:
a fixed flat reference surface;
first and second actuator means each having a fixed portion directly anchored to said reference surface, the first and second actuator means each having a respective moveable portion that is linearly moveable, wherein the first and second actuator moveable portions are restricted to movement in respective first and second orthogonal linear dimensions parallel to said reference surface;
a moveable platform for holding a workpiece, the moveable platform being supported for planar movement over said reference surface;
a first coupling between the first actuator moveable portion and the moveable platform for controlling the position of the platform in the first linear dimension, the first coupling permitting free movement of the platform in the second linear dimension; and
a second coupling between the second actuator moveable portion and the moveable platform for controlling the position of the platform in the second linear dimension, the second coupling permitting free movement of the platform in the first linear dimension.

27. A planar positioning system as claimed in claim 26, wherein the first actuator means comprises two linear actuators arranged substantially parallel to each other with the second actuator means positioned therebetween.

28. A planar positioning system as claimed in claim 26, wherein the reference surface is formed from at least one block having a flat upper surface.

29. A planar positioning system as claimed in claim 28, wherein the reference surface is formed comprises two reference surface portions spaced apart from one another and wherein one of the first and second actuator means extends between the two reference surface portions.

30. A planar positioning system as claimed in claim 26, wherein the moveable platform is supported by the reference surface by means of support bearings.

31. A planar positioning system as claimed in claim 30, wherein the support bearings comprise non-contact bearings such as aerostatic bearings.

32. A planar positioning system as claimed in claim 26, wherein the first coupling includes a first push bar mounted for movement with the first actuator moveable portion for transmission of forces from the first actuator means to the moveable platform in the first linear dimension, the first coupling allowing free movement of the platform in the second linear dimension.

33. A planar positioning system as claimed in claim 32, wherein the first push bar includes two straight parallel guiding surfaces extending in the second linear dimension along which first bearings mounted on the moveable platform can move, said guiding surfaces serving to transmit forces from the first actuator means to the moveable platform in the first linear dimension.

34. A planar positioning system as claimed in claim 33, wherein the first bearings comprise non-contact bearings such as aerostatic bearings.

35. A planar positioning system as claimed in claim 26, wherein the second coupling includes a second push bar mounted for movement with the moveable platform for transmission of forces from the second actuator means moveable portion to the moveable platform in the second linear dimension, the second coupling allowing free movement of the platform in the first linear dimension.

36. A planar positioning system as claimed in claim 35, wherein the second push bar includes two straight parallel guiding surfaces extending in the first linear dimension along which second bearings mounted to the second actuator moveable portion can move, said guiding surfaces serving to transmit forces from the second actuator means to the moveable platform in the second linear dimension.

37. A planar positioning system as claimed in claim 36, wherein the second bearings comprise non-contact bearings such as aerostatic bearings.

38. A planar positioning system as claimed in claim 26, wherein the first and second actuator means are selected from the group consisting of: magnetic brushless U-channel linear motors; magnetic brushless tubular linear motors; voice coil linear motors; piezo or ultrasonic linear motors.

* * * * *